(12) United States Patent
Berg

(10) Patent No.: US 11,637,550 B2
(45) Date of Patent: Apr. 25, 2023

(54) CLOCK SELECTOR CIRCUIT

(71) Applicant: Nordic Semiconductor ASA, Trondheim (NO)

(72) Inventor: Simon Berg, Trondheim (NO)

(73) Assignee: Nordic Semiconductor ASA, Trondheim (NO)

( * ) Notice: Subject to any disclaimer, the term of this patent is extended or adjusted under 35 U.S.C. 154(b) by 0 days.

(21) Appl. No.: 17/685,288

(22) Filed: Mar. 2, 2022

(65) Prior Publication Data

US 2022/0286122 A1    Sep. 8, 2022

(30) Foreign Application Priority Data

Mar. 3, 2021  (GB) ..................................... 2102971

(51) Int. Cl.
*H03K 5/01* (2006.01)
*H03K 5/135* (2006.01)
(Continued)

(52) U.S. Cl.
CPC .............. *H03K 5/135* (2013.01); *G06F 1/08* (2013.01); *H03K 4/026* (2013.01)

(58) Field of Classification Search
CPC .......... H03K 5/135; H03K 4/026; G06F 1/08; G06F 1/12; G06F 1/06
(Continued)

(56) References Cited

U.S. PATENT DOCUMENTS 5,357,146 A     10/1994   Heimann
5,381,542 A  *  1/1995   Carlson ..................... G06F 1/08
                                              713/601

(Continued)

FOREIGN PATENT DOCUMENTS

WO     WO 2021/122816 A1    6/2021

OTHER PUBLICATIONS

Zhang et al., "An improved fast acquisition phase frequency detector for high speed phase-locked loops," AIP Conference Proceedings 1955, 040030 (2018); https://doi.org/10.1063/1.5033694, Published Online: Apr. 18, 2018.

(Continued)

*Primary Examiner* — Ryan Jager
(74) *Attorney, Agent, or Firm* — Klarquist Sparkman, LLP

(57) ABSTRACT

A clock selector circuit includes a first input for receiving a reference clock signal having a reference frequency, a second input for receiving an offset clock signal having an offset frequency, a clock output for outputting the reference or offset clock signal, and switching circuitry. The switching circuitry includes a switching input and sign detector circuitry that outputs a sign signal indicating whether the reference clock signal is leading the offset clock signal in phase. In response to receiving a switching signal, the switching circuitry detects when like edges of the reference clock signal and the offset clock signal are aligned to within a predetermined tolerance, with the new signal leading the current signal if the offset frequency is lower than the reference frequency, or with the new clock signal trailing the current clock signal if not. In response, the switching circuitry switches to outputting the new clock signal.

15 Claims, 7 Drawing Sheets

(51) Int. Cl.
*G06F 1/08* (2006.01)
*H03K 4/02* (2006.01)

(58) Field of Classification Search
USPC .......................................................... 327/165
See application file for complete search history.

(56) References Cited

U.S. PATENT DOCUMENTS

| | | | | |
|---|---|---|---|---|
| 6,163,583 | A * | 12/2000 | Lin | G06F 1/324 |
| | | | | 713/600 |
| 6,429,698 | B1 * | 8/2002 | Young | G06F 1/08 |
| | | | | 327/99 |
| 6,653,867 | B1 | 11/2003 | Shihadeh | |
| 6,806,755 | B1 * | 10/2004 | Simmonds | G06F 1/08 |
| | | | | 327/99 |
| 7,911,239 | B2 | 3/2011 | Saint-Laurent et al. | |
| 2005/0012530 | A1 | 1/2005 | Hashimoto et al. | |
| 2005/0017763 | A1 | 1/2005 | Slobodnik et al. | |
| 2008/0012605 | A1 | 1/2008 | Cheung | |
| 2015/0227162 | A1 | 8/2015 | Zhu et al. | |
| 2017/0177020 | A1 | 6/2017 | Mukherji et al. | |
| 2022/0286122 | A1 * | 9/2022 | Berg | G06F 1/08 |

OTHER PUBLICATIONS

Renesas Electronics Corporation, "Zero Delay Glitch-Free Clock Multiplexer," © Renesas Electronics Corporation, ICS581-01/02, Mar. 2020, 11 pages.

* cited by examiner

CLOCK SELECTOR CIRCUIT

CROSS-REFERENCE TO RELATED APPLICATION

This application claims priority from Great Britain Application Number GB2102971.5, filed on Mar. 3, 2021, which application is incorporated herein by reference in its entirety.

BACKGROUND OF THE INVENTION

This invention relates to a clock selector circuit.

Clock signals are used to coordinate the action of electronic circuits, especially integrated circuits. Typically, a periodic signal is generated by a quartz crystal oscillator and is distributed to clocked circuit elements, such as D-type flip-flops, over one or more clock wires in the electronic circuit. The periodic signal may be used directly as a clock signal, or the electronic circuit may derive a clock signal from the periodic signal—e.g. using clock multiplier or divider circuits. The clock signal is typically a single-phase square wave signal.

Quartz crystal oscillators are often used to generate high-frequency and high-accuracy clock signals. However, crystal oscillators consume considerable power, and generally output a clock signal of a fixed frequency, with only marginal fluctuations as a result of changes in temperature and supply voltage. Resistor-capacitor (RC) oscillators and inductor-capacitor (LC) oscillators can generate clock signals more efficiently than crystal oscillators, with the trade-off of generally being less accurate than crystal oscillators and being more affected by changes in temperature and supply voltage. Feedback and control mechanisms can mitigate this to an extent, but RC and LC oscillators are still typically less accurate than high-quality crystal oscillators. One distinct advantage of RC and LC oscillators though is that they can be integrated into voltage-controlled oscillators (VCO) and digitally-controlled oscillators (DCO), which enable the output frequency of an oscillator to be adjusted using control signals.

It can therefore be advantageous to provide an electronic device, such as a battery-powered Internet-of-Things (IoT) sensor, with multiple clock sources—e.g. both a crystal oscillator and a DCO. The device can then switch between the clock sources, when clocking the same circuitry, depending on requirements. For example, a system-on-chip (SoC) device may be configured to use a highly accurate clock derived from a crystal oscillator when an on-chip analog-to-digital (ADC) peripheral, requiring high clock purity, is active, and to use a clock derived from a lower-power DCO at other times such as when the device is in a sleep state, or when adjustment to a clock frequency is required.

Clock signals derived from different oscillators can have the same nominal frequency, but they will not typically be aligned in phase. It is therefore not straightforward to switch an electronic circuit seamlessly from using one clock signal to using a different clock signal, as the resultant output clock signal can include switching artefacts, with at least one clock cycle being distorted—e.g. shortened or lengthened. Such artefacts can cause the frequency of the output clock signal to shift outside a frequency range specified for the circuit, resulting in errors, which may be intermittent or unpredictable and therefore hard to debug.

The present invention provides a clock selector circuit for improved switching between clock signals.

SUMMARY OF THE INVENTION

From a first aspect, the invention provides a clock selector circuit comprising:

a first input for receiving a reference clock signal having a reference frequency;
a second input for receiving an offset clock signal having an offset frequency, wherein the offset frequency differs from the reference frequency by a frequency offset;
a clock output for outputting the reference clock signal or the offset clock signal as an output clock signal; and
switching circuitry,
wherein the switching circuitry comprises a switching input and is arranged, when the clock selector circuit is outputting a current one of the reference and offset clock signals as the output clock signal, in response to receiving a switching signal at the switching input indicating that the output clock signal should be switched to be a new one of the reference and offset clock signals, to detect when like edges of the reference clock signal and the offset clock signal are aligned to within a predetermined tolerance with the new clock signal leading the current clock signal in phase, if the offset frequency is lower than the reference frequency, or with the new clock signal trailing the current clock signal in phase, if the offset frequency is higher than the reference frequency, and, in response to said detection, to switch to outputting the new clock signal from the clock output.

From a second aspect, the invention provides a method of switching clock signals, the method comprising:

receiving a reference clock signal having a reference frequency;
receiving an offset clock signal having an offset frequency, wherein the offset frequency differs from the reference frequency by a frequency offset;
outputting a current one of the reference clock signal and the offset clock signal as an output clock signal;
receiving a switching signal indicating that the output clock signal should be switched to be a new one of the reference clock signal and the offset clock signal;
in response to receiving the switching signal, detecting when like edges of the reference clock signal and the offset clock signal are aligned to within a predetermined tolerance with the new clock signal leading the current clock signal in phase, if the offset frequency is lower than the reference frequency, or with the new clock signal trailing the current clock signal in phase, if the offset frequency is higher than the reference frequency; and
in response to said detecting, starting to output the new clock signal as the output clock signal.

Thus it will be seen that, in accordance with the invention, the two input clock signals are offset from each other in frequency, at least around the time of switching, such that there is a phase difference between the clock signals that changes over time (typically linearly if the frequency offset remains constant). The clock selector circuit preferably detects when the two clock signals are closely aligned in phase by determining when the rising edges and/or falling edges of the two input clock signals arrive within a predetermined time interval of each other. By switching between the two clock signals only when they are in phase, to within a predetermined tolerance, the switching circuit can limit frequency fluctuations in the output clock signal around the moment of switching.

Moreover, when the offset frequency is offset below the reference frequency, by switching only when the new clock signal is leading the current clock signal in phase, any frequency fluctuation that may still occur on the output clock will be in the upwards direction—i.e. serving to increase the frequency of the output clock. In this way, the fluctuation acts in the opposite direction from the negative offset of the offset frequency, and brings the average frequency of the output clock closer to the reference frequency. This can help to avoid the output frequency dropping below an acceptable limit. Similarly, when the offset frequency is offset above the reference frequency, by switching only when the new clock signal is trailing the current clock signal in phase, any frequency fluctuation that may still occur on the output clock will be in the downwards direction, so again act to bring the frequency of the output clock closer to the reference frequency.

In other words, by detecting when the new clock signal is leading the current clock signal in phase (if the offset frequency is lower than the reference frequency), or when the new clock signal is trailing the current clock signal in phase (if the offset frequency is higher than the reference frequency), the average frequency of the output clock signal over the course of a switch between clock sources is increased if the offset frequency is greater than the reference frequency, or decreased if the offset frequency is less than the reference frequency.

In some embodiments or applications of embodiments, components of an electronic device such as an integrated-circuit chip (e.g. flip-flops, microprocessors, etc.) may rely on the clock signal output by the clock switching circuit for timing purposes, and excessive changes in the output clock frequency may cause such components to malfunction or operate sub-optimally. It may therefore be desirable that, around the moment of switching, the frequency of the output clock signal remains close to the reference frequency so as to avoid unwanted behaviour in any components relying on the output clock signal for timing purposes. In some applications, components relying on the output clock signal may be able to continue operating without issue if the output clock signal frequency does not increase or decrease from the reference frequency by more than a predetermined tolerance (e.g. no more than 5%, 2%, 1%, 0.5%, etc.).

In order to make sure that the output clock frequency does not fluctuate outside of a predetermined tolerance around the moment of switching, it has been recognised that the direction of the frequency fluctuation around the moment of switching (i.e. increase or decrease) should be the opposite to the direction of frequency skew applied to the offset clock signal. This is achieved by embodiments disclosed herein.

The switching is preferably performed when the reference and offset clock signals are in the same state (e.g. HIGH or LOW, logical '1' or logical '0', etc.). This can further reduce frequency fluctuations in the output clock signal as a result of switching from a clock signal in one state to a clock signal in a different state. The clock selector circuit may be arranged to switch to outputting the new clock signal from the clock output within less than half a clock period of the reference clock signal after the switching circuitry detects that like edges of the reference clock signal and the offset clock signal are aligned to within a predetermined tolerance with the new clock signal leading the current clock signal in phase, if the offset frequency is lower than the reference frequency, or with the new clock signal trailing the current clock signal in phase, if the offset frequency is higher than the reference frequency.

The clock selector circuit may enable switching between two clock signals while continuously outputting an output clock signal, which can be used by other components in a device, without requiring a third input clock signal operating at a much higher frequency than the first and second input clock signals to coordinate the switching process. Such a higher-frequency clock signal may not be available, and even if a higher-frequency clock source is available, using it to control a switch between two lower-frequency clock signals may increase power consumption and complexity, and present additional design constraints. Instead, embodiments of the present clock selector circuit can operate using only the timing provided by the reference and offset clock signals themselves.

The reference clock signal may be generated by a crystal oscillator. The offset clock signal may be generated by a controllable oscillator such as a digitally controlled oscillator (DCO). The clock selector circuit may, in some embodiments, be configured to control the frequency of the offset clock signal. This may be done by the switching circuitry outputting a digital control signal to a DCO outputting the offset clock signal.

Some embodiments may be arranged only to receive an offset clock signal that is lower than the reference frequency. Such embodiments may comprise circuitry for detecting and switching when the new clock signal is leading the current clock signal in phase. Some embodiments may be arranged only to receive an offset clock signal that is higher than the reference frequency. Such embodiments may comprise circuitry for detecting and switching when the new clock signal is trailing the current clock signal in phase. Other embodiments may be arranged to receive an offset clock signal that can be higher or lower than the reference frequency. Such embodiments may comprise circuitry for detecting and switching when the new clock signal is leading the current clock signal in phase, and circuitry for detecting and switching when the new clock signal is trailing the current clock signal in phase.

The switching circuitry may comprise phase-alignment detector circuitry arranged to output a phase-alignment signal indicating whether or when like edges of the reference clock signal and the offset clock signal are aligned to within the predetermined tolerance. It may comprise a reset input for resetting the phase-alignment signal. It may be configured to signal in response to detecting that like edges of the reference clock signal and the offset clock signal are aligned to within the predetermined tolerance—e.g. to signal upon first detecting such alignment after a latest reset. The switching circuitry may detect phase alignment based only on rising edges of the clock signal, or based only on falling edges, but in preferred embodiments the switching circuitry determines phase alignment based both on rising edges and falling edges. This may enable the circuitry to detect phase alignment with greater responsiveness, and so enable faster switching times. It may also enable the use of a larger frequency offset, which may also support faster phase convergence and hence shorter switching delays.

In some embodiments, the switching circuitry may comprise sign detector circuitry arranged to output a sign signal indicating whether or when the reference clock signal is leading the offset clock signal in phase. In some embodiments, the switching circuity may comprise sign detector circuitry arranged to output a sign signal indicating whether or when the reference clock signal is trailing the offset clock signal in phase. It may be configured to signal in response to detecting that like edges of the reference clock signal and the offset clock signal are aligned to within the predetermined tolerance. In some embodiments, the same sign detector circuitry and/or the same sign signal may be able to indicate both conditions—e.g. by having a binary state that depends on whether the reference clock signal is leading or is trailing the offset clock signal in phase. In general, a first clock signal may be determined to be leading a second clock signal in phase when a rising edge of the first clock occurs while the second clock signal is still low and/or when a falling edge of the first clock signal occurs while the second clock signal is still high.

The phase-alignment detector circuitry may be a phase-alignment detector. The sign detector circuitry may be a sign detector.

The switching circuitry is preferably configured to use the phase-alignment signal and the sign signal to determine when to start outputting the new clock signal from the clock output. It may be arranged to combine the phase-alignment signal and the sign signal into a single detection signal, which may be indicative of both a phase-alignment condition and a sign (i.e. leading/trailing) condition being met. It may combine the phase-alignment signal and the sign signal in a logic gate, such as an AND gate, which outputs the detection signal.

The output clock signal may be connected to circuitry that is arranged to be clocked by the output clock signal. This may include a processor, and/or a peripheral, etc. The circuitry may be arranged to be clocked using a predetermined type of clock edge, such as a rising edge.

The reference and offset clock signals preferably have similar frequencies. The frequency offset may be less than 10%, or less than 1%, or less than 0.5%, or less than 0.1% of the reference frequency. In this way, the output clock signal can have a constant nominal frequency (equal to the reference frequency) within a predetermined tolerance (e.g. +/−10%, or 1%, or 0.5%, or 0.1%), regardless of which input clock signal is being output. In some embodiments, the reference and offset clock signals both have a frequency in the range 16 MHz+/−10%, or 1%, or 0.5%, or 0.1%. The frequency offset may be at least 0.01%, or at least 0.1%, in order to ensure that there is not an excessive delay between instances at which like edges of the reference and offset clock signals align within the predetermined tolerance. As a result, the switching between clock signals can occur in a timely manner after the clock selector circuit receives a switching signal indicating that the output clock signal should be switched.

The phase-alignment detector circuitry may be arranged to generate a pulse (negative or positive) each time a rising edge, or a falling edge, or a rising or falling edge, occurs in the reference clock signal. The phase-alignment detector circuitry may be arranged to generate a pulse (negative or positive) each time a rising edge, or a falling edge, or a rising or falling edge, occurs in the offset clock signal. It may be arranged to use these pulses to generate a pulse each time an edge (rising, falling, or either) of the reference clock signal and a like edge (rising, falling, or either) of the offset clock signal occur within a predetermined time interval of each other. It may be configured also to generate a pulse each time an opposite edge occurs within the predetermined time interval, but may comprise logic for subsequently blocking or filtering out such opposite-edge pulses. The phase-alignment detector circuitry may comprise one or more delay elements which may determine the predetermined time interval.

This may be accomplished in various ways. However, in one set of embodiments, the phase-alignment detector circuitry comprises one or more logic gates. One input of a first logic gate (e.g. XNOR or XOR gate) may be configured to receive the reference clock signal and another input of the first logic gate may be configured to receive a time-delayed version of the reference clock signal. One input of a second logic gate (e.g. XNOR or XOR gate) may be configured to receive the offset clock signal and another input of the second logic gate may be configured to receive a time-delayed version of the offset clock signal. In a set of embodiments, the time-delayed version of the reference clock signal may be generated by passing the reference clock signal through a first delay element configured to introduce a propagation delay to the reference clock signal. Similarly, the time-delayed version of the offset clock signal may be generated by passing the offset clock signal through a second delay element. The first and second delay elements may be configured to introduce the same propagation delay to the reference and offset clock signals respectively, optionally within a small margin of error. The propagation delay(s) may be a fraction of one cycle of the reference clock—e.g. less than 1% or less than 10%. The outputs of the first and second logic gates may be combined in a further logic gate (e.g. an OR gate), which may generate an alignment pulse each time an edge of the reference clock signal occurs within a predetermined time interval of an edge of the offset clock signal.

A third logic gate may be arranged for filtering alignment pulses corresponding to opposite (i.e. not alike) edges. One input of a third logic gate (e.g. XNOR gate) may be configured to receive the reference clock signal and another input of the third gate may be configured to receive the offset clock signal.

In a set of embodiments, the phase-alignment detector circuitry comprises a latch, preferably in combination with a combining logic gate (e.g. a NOR or AND gate) and/or a final gate (e.g. an AND gate). The latch is preferably an asynchronous latch. The latch may be a set-reset (SR) latch. The output of said first logic gate may be coupled to one input of the combining logic gate, and the output of said second logic gate may be coupled to another input of the combining logic gate. The output of said third logic gate may be coupled to one input of the final gate, and the output of the combining logic gate may be coupled to another input of the final gate. The output of the final gate may be coupled to a set input of the latch.

The inclusion of first and second XNOR or XOR gates within the phase detector circuitry causes the generation of a pulse, the duration of which is determined by the time delay introduced by the delay elements, each time an edge (rising or falling) occurs in the first and second clock signal. The inclusion of the combining gate causes the generation of a pulse each time an edge (rising or falling) of the reference clock signal and an edge (rising or falling) of the offset clock signal occur within a predetermined maximum time interval of each other, which may be determined by the time delay introduced by the delay elements. The inclusion of a third XNOR gate and a final AND gate causes the generation of an output pulse each time like edges (i.e. both rising or both falling) of the reference and offset clock signals occur within the predetermined time interval of each other, while preventing the generation of an output pulse each time different edges (i.e. one rising and one falling) of the reference and offset clock signals occur within the predetermined time interval of each other, thereby preventing the spurious detection of phase alignment when opposite edges in the reference and offset clock signals are aligned (i.e. when the clock signals are around 180 degrees out-of-phase). As a result, the phase-alignment detector circuitry may be configured to only detect the alignment of like edges in the reference and offset clock signals, within a predetermined tolerance, and ignore detections of the alignment of different edges in the reference and offset clock signals.

In some embodiments, the sign detector circuitry comprises one or more edge alignment detectors. A first edge alignment detector may be configured to output a pulse each time a falling edge of the reference clock signal is detected while the offset clock signal is high (i.e. before a next falling edge of the offset clock signal). A second edge alignment detector may be configured to output a pulse each time a rising edge of the reference clock signal is detected while the offset clock signal is low (i.e. before a subsequent rising edge of the offset clock signal). The inclusion of such first and second edge alignment detectors in the sign detector circuitry may cause the sign detector circuitry to determine whether or when the reference clock signal is leading the offset clock signal in phase, for both rising and falling edges. This is advantageous as this enables the determination of which input clock signal is leading in phase at a higher frequency (i.e. with a shorter interval between times at which the determination can be made) than if the sign detector circuitry were only able to determine this on a rising edge, e.g. as a result of the inclusion of only a single edge alignment detector. However, in some less preferred embodiments, the sign detector circuitry may comprise one only such edge alignment detector.

In some embodiments, the first edge alignment detector comprises a falling edge pulse generator, an inverter and a latch. The latch may be an asynchronous SR latch. An input of the falling edge pulse generator may be configured to receive the reference clock signal, and an output of the falling edge pulse generator may be coupled to a set input of the latch. An input of the inverter may be arranged to receive the offset clock signal, and an output of the inverter may be coupled to a reset input of the latch.

In some embodiments, the second edge alignment detector comprises a rising edge pulse generator and a latch. The latch may be an asynchronous SR latch. An input of the rising edge pulse generator may be configured to receive the reference clock signal, and an output of the rising edge pulse generator may be coupled to a set input of the latch. A reset input of the latch may be arranged to receive the offset clock signal.

In some embodiments, the sign detector circuitry comprises an OR gate. One input of the OR gate may be coupled to an output of the first edge alignment detector, and another input of the OR gate may be coupled to an output of the second edge alignment detector. The sign detector circuitry may comprise an output latch having a set input that is coupled to an output of the OR gate The sign detector may be configured to determine when the reference clock signal is no longer leading the offset clock signal in phase, and to signal (e.g. by outputting a pulse) when the reference clock signal has not been leading the offset clock signal in phase for a predetermined period of time (e.g. a fixed number of clock cycles of the reference or offset clock signal). The sign detector circuitry may comprise counter circuitry, which it may use for making this determination. An overflow output of the counter circuitry may be coupled directly or indirectly (e.g. via a pulse generator) to a reset input of the output latch. The number of clock cycles after which the counter circuitry signals an overflow may be e.g. 64 cycles, 32 cycles, 16 cycles, 8 cycles, etc.

The counter circuitry may comprise a counter, which may be an asynchronous counter such as a ripple counter—e.g. a four-bit ripple counter. The counter may comprise a reset input for resetting the counter. This may be coupled to the output of the OR gate. It may be coupled to the OR gate directly (e.g. if active-low) or via an inverter (e.g. if active-high). A count input of the counter may be arranged to receive the offset clock signal, or to receive the reference clock signal. An overflow output of the ripple counter may be coupled to an input of a pulse generator, e.g. a rising edge pulse generator. The counter may be arranged to hold a current count (i.e. to stop counting, until reset) in response to the counter overflowing. This may be implemented in any appropriate way; in some embodiments, an enable (or disable) input of the counter is coupled, directly or indirectly, to an overflow output of the counter—e.g. an inverter may connect the overflow output to an active-high enable input.

The switching circuitry may comprise a multiplexer for switching the clock output.

An output of the phase-alignment detector circuitry and an output of the sign detector circuitry may be combined in a logic gate, such as an AND gate. The switching circuitry may use the output of this logic gate to determine when to switch to outputting the new clock signal from the clock output. Switching may be prevented until both a phase-alignment condition and a leading or trailing condition are satisfied by the reference and offset clock signals. The switching circuitry may comprise an asynchronous finite state machine (AFSM) which may receive an output of this logic gate. The AFSM may control a multiplexer for switching the clock output.

The clock selector circuit may be configured to toggle the clock output between the reference clock signal and the offset clock signal in response to switching signals received at the switching input. The switching signal may thus simply indicate that the output clock signal is to be toggled, or it may identify the new clock signal. In some embodiments, the clock selector circuit may comprise one or more further inputs for receiving one or more further clock signals, and may be configured for switching the output clock signal to be one of three or more input clock signals.

It will be appreciated that the various components described herein (e.g. latches, inverters, logic gates, pulse generators, ripple counters, etc.) may comprise any appropriate combination of analogue or digital electronic components configured to implement appropriate logic or timing operations, e.g. resistors, capacitors, inductors, transistors of any appropriate type (e.g. MOSFET, PMOS, NMOS, BJT, NPN, PNP, etc.), diodes, etc.

In some embodiments, the clock selector circuit may comprise control logic configured to send a control signal to a controllable oscillator to cause the offset clock signal to be offset from the reference frequency by the frequency offset in response to receiving the switching signal. It may signal for the offset clock signal to be set equal to the reference frequency after the switch has occurred. However, in other embodiments the offset frequency may be permanently offset from the reference frequency.

The clock selector circuit may be part of an electronic apparatus. It may be at least partly integrated on an integrated-circuit chip, e.g. on a silicon wafer. It may be part of a system-on-chip device. From a further aspect, the invention provides an electronic apparatus comprising the clock selector circuit. The electronic apparatus may comprise one or more quartz crystals, which may be used to generate the reference clock signal. The electronic apparatus may comprise one or more resistor-capacitor (RC) or inductor-capacitor (LC) oscillator (e.g. a DCO), which may be configured to generate the reference and/or offset clock signals. The electronic apparatus may comprise one or more components that are clocked by the output clock signal.

The terms "circuit" and "circuitry" as used herein may refer to open circuits or to closed circuits; i.e. they encompass circuit portions that may form part of a closed circuit when connected to other elements such as a power supply.

Features of any aspect or embodiment described herein may, wherever appropriate, be applied to any other aspect or embodiment described herein. Where reference is made to different embodiments or sets of embodiments, it should be understood that these are not necessarily distinct but may overlap.

BRIEF DESCRIPTION OF THE DRAWINGS

Certain preferred embodiments of the invention will now be described, by way of example only, with reference to the accompanying drawings, in which:

FIG. 2 is timing diagram illustrating the edge timing of two clock signals to be switched between;

DETAILED DESCRIPTION

Figure 1:
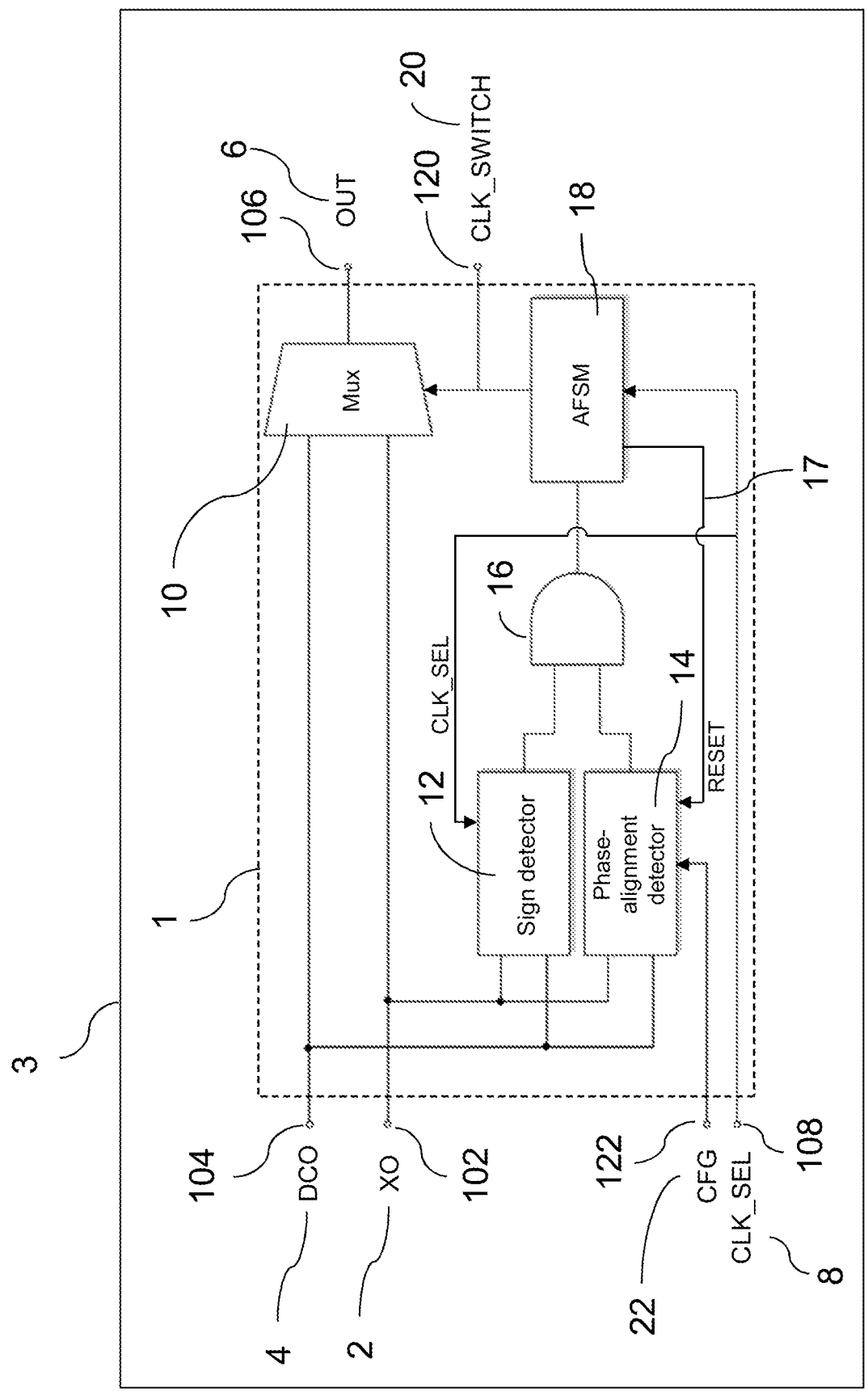
FIG. 1 is a schematic diagram of clock signal switching circuitry according to an embodiment of the invention.

FIG. 1 shows a schematic diagram of a clock signal switching circuit 1 according to an embodiment of the invention. In this embodiment, the switching circuit 1 is part of a semiconductor system-on-chip (SoC) 3.

The circuit 1 has inputs 102, 104 for receiving two respective input periodic clock signals, one clock signal 2 originating from a crystal oscillator (XO) (which may be located off the chip 3), and another clock signal 4 originating from a digitally controlled oscillator (DCO) (which may be located elsewhere on the chip 3), and an output 106 for outputting a single periodic clock signal (OUT) 6. The output signal 6 may then be used to clock synchronous logic circuitry, such as a processor or digital radio, located elsewhere on the SoC 3—e.g. circuitry that is clocked by the rising edge of the output signal 6 (or, in alternative embodiments, by the falling edge).

In typical usage, the frequency of the XO signal 2 defines a desired nominal frequency for the output signal 4, but the DCO signal 4 will be deliberately offset (skewed) somewhat from the XO signal 2, so that the phase relationship of the two signals 2, 4 changes progressively over a number of cycles to facilitate smooth switching, as described below.

The circuit 1 is configured to output a selected one of the two input clock signals XO 2 or DCO 4 as the output clock signal 6, and to smoothly switch between the two input clock signals XO 2 and DCO 4 with minimal frequency fluctuations at the output signal 6. It will be appreciated that the input signals 2 and 4 are not limited to a crystal oscillator and digitally controlled oscillator as shown in FIG. 1, but that the circuit 1 may be used to smoothly switch between two clock signals originating from any appropriate source.

The circuit 1 is configured to smoothly switch the output clock signal 6 from the XO clock signal 2 to the DCO clock signal 4, or vice versa, in response to a clock select signal CLK_SEL 8 at a clock switching input 108. The clock select signal CLK_SEL 8 may be received from a processor or other component outside the switching circuit 1. Rather than switching immediately, the circuit 1 delays switching until suitable conditions are met for a smooth switch to the newly-selected signal, that reduces any deviation away from the desired nominal frequency.

The circuit 1 comprises a multiplexer 10, a sign detector circuit 12, a phase-alignment detector circuit 14, an AND gate 16 and an asynchronous finite state machine (AFSM) 18. The multiplexer 10 takes the XO clock signal 2 and the DCO clock signal 4 as inputs, and outputs a selected one of them as the output clock signal 6. The AFSM 18 outputs a switching signal CLK_SWITCH 20 to the multiplexer 10 which the multiplexer 10 uses as its control input. The CLK_SWITCH signal 20 is also made available at a clock-switch output 120, as a signal of what clock is currently in use, which may be useful to other components of the SoC 3. The AFSM 18 controls whether the multiplexer 10 outputs, as the output signal 6, the XO clock signal 2 or the DCO control signal 4.

In variant embodiments, the various components of the circuit 1 may be connected by one or more printed circuit boards and/or may be integrated in one or more silicon chips in any appropriate combination. It will be appreciated that a device 3 comprising the circuit 1 may contain other elements, such as buses, crystals, digital logic, analog circuitry, discrete active components, discrete passive components, processors, user interface components, etc. which are not shown in FIG. 1 for the sake of simplicity.

The XO clock signal 2 and the DCO clock signal 4 are both coupled to the inputs of the sign detector 12 and the phase-alignment detector 14. The phase-alignment detector 14 is arranged to output a signal when like edges (i.e. both rising edges or both falling edges) of the XO clock signal 2 and the DCO clock signal 4 are aligned to within a predetermined margin. The phase-alignment detector 14 signals only when the XO signal 2 and the DCO signal 4 are close to being in-phase, rather than close to being 180° out of phase. The sign detector 12 is arranged to signal which of the XO clock signal 2 or DCO clock signal 4 is leading in phase over any given cycle—i.e. which of the signals has a rising edge while the other is still low and/or has a falling edge while the other is still high. The operation of the sign detector 12 will be described in further detail below with reference to FIG. 6. The operation of the phase-alignment detector 14 will be described in further detail below with reference to FIG. 4.

The outputs of the sign detector 12 and the phase-alignment detector 14 are coupled to the inputs of the AND gate 16. The AND gate 16 therefore outputs a signal when both the sign detector 12 and phase-alignment detector 14 simultaneously indicate a positive signal, indicative of conditions being appropriate for switching between the clock signals 2 and 4, as will be described in further detail below. The output of the AND gate 16 is then coupled to an input of the AFSM 18, enabling the AFSM to determine when to switch the output 6 of the multiplexer 10 from the current input clock signal 2 or 4 to the newly-selected signal, while maintaining the frequency of the output clock signal 6 within a pre-defined margin of error.

The CLK_SEL signal 8 is coupled to an input of the AFSM 18, as well as being provided to the sign detector 12. The CLK_SEL signal 8 originates from a different part of a device 3 containing the clock signal switching circuit 1 (e.g. from a microcontroller). The CLK_SEL signal 8 indicates which of the two input clock signals 2 or 4 should next be output by the circuit 1. The AFSM 18, taking the CLK_SEL signal 8 as one of its inputs, detects when the device containing the circuit 1 wishes to switch from one clock signal 2 or 4 to the other, and determines the appropriate time at which to perform the switch based on the signal output by the AND gate 16 (and consequently, the outputs of the sign detector 12 and phase-alignment detector 14).

The phase-alignment detector 14 receives a reset signal 17 from the AFSM 18 for resetting the detector.

The phase-alignment detector 14 also takes a configuration (CFG) signal 22 as an input at a configuration input 122 (e.g. from a microcontroller or other processor). This can be used to configure the delay in the phase-alignment detector 14. This can be useful when using a larger skew on the DCO clock so as to make switching faster. A larger skew can shorten the time for alignment to occur, but at the cost of reduced output frequency stability.

Figure 2:
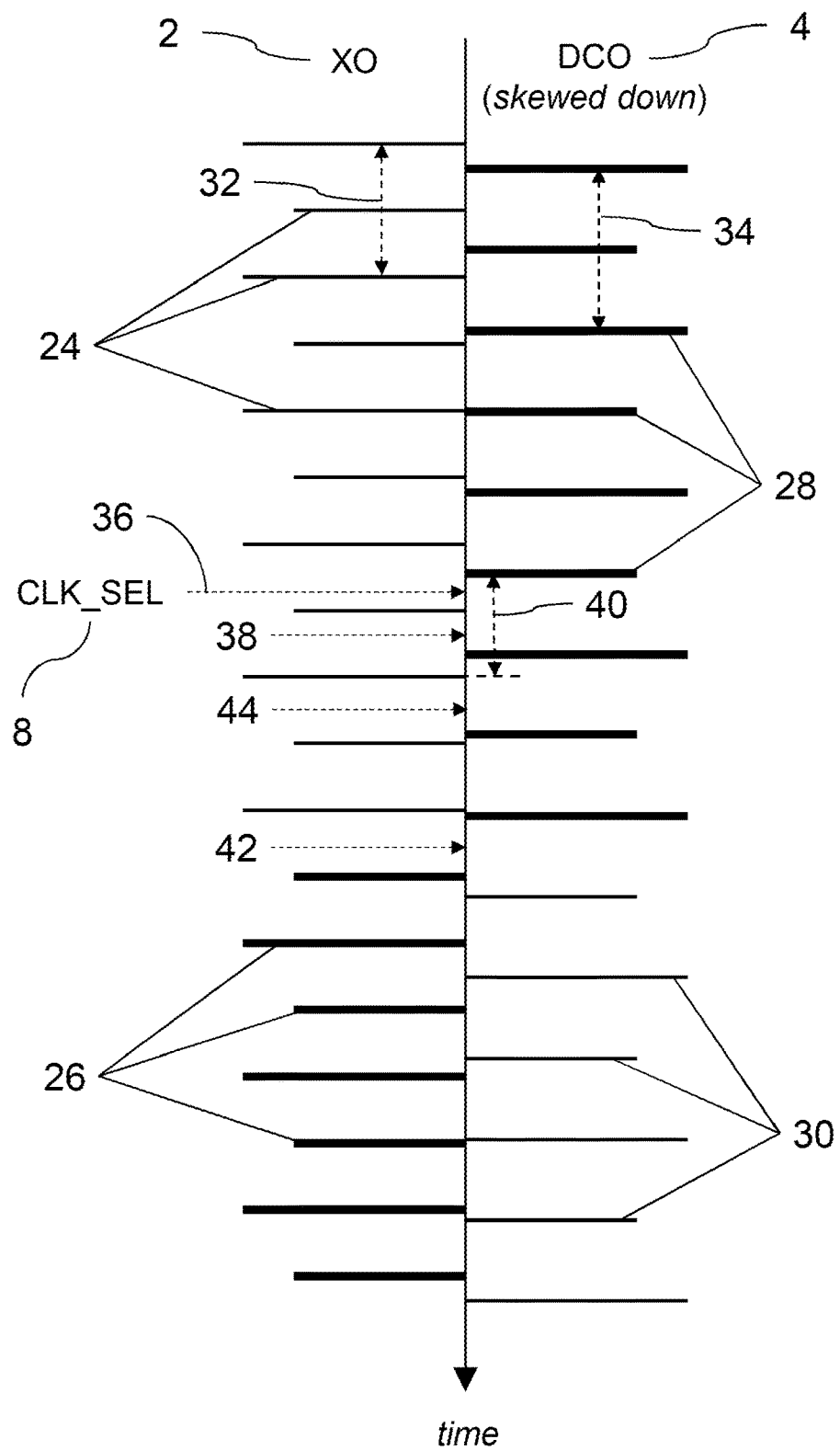

FIG. 2 is a timing diagram illustrating the edge timing of two clock signals to be switched between, in order to illustrate some of the principles behind the operation of the clock signal switching circuit 1. Shown in FIG. 2 are periodic clock edge indicators 24, 26, 28 and 30 for the XO clock signal 2 and the DCO clock signal 4 respectively. The edge indicators 24 to 30 indicate the time at which each edge occurs for each clock signal 2 and 4. Rising edges are indicated by the long edge indicators 24-30, and falling edges are indicated by the short edge indicators 24-30. The cycle period of the XO clock signal 2 is therefore equal to the time difference 32, and the cycle period of the DCO clock signal 4 is equal to the time difference 34. The thick edge indicators 26 and 28 indicate the edges of the output clock signal 6.

The XO clock signal 2 and the DCO clock signal 4 have the same nominal frequency—e.g. 16 MHz or any other frequency. When switching the output clock signal 6 between two clock signals of the same nominal frequency, it is important to avoid sharp increases or decreases in frequencies at the output in order to provide a continuous output clock signal with only minor frequency fluctuations at the time of switching. In order to avoid sharp changes in frequency at the moment of switching, the DCO clock signal 4 is intentionally skewed down, in order to slightly decrease its frequency (e.g. by 0.5%) relative to its nominal operation frequency. As a result, the phase relationship between the XO clock signal 2 and the DCO clock signal 4 changes over time. Additionally, over a long enough period of time, typically covering multiple clock cycles, the identity of the clock signal that is leading in phase (i.e. that has its rising or falling edge occurring in the half-cycle-period before a corresponding edge of the other clock signal) switches between the XO clock signal 2 and the DCO clock signal 4. This change can be seen in FIG. 2.

Initially, as shown by the thickened edge indicators 28, the circuit 1 is outputting the DCO clock signal 2. At time 36, the circuit 1 receives a CLK_SEL signal 8 indicating that the circuit 1 should switch from outputting the DCO clock signal 4 to outputting the XO clock signal 2. If the circuit were to switch to the XO clock signal immediately after receiving the CLK_SEL signal 8 at time 36, the output clock signal 6 would switch from LOW to HIGH at the moment of switching (as the DCO clock signal 4 is LOW at time 36, whereas the XO clock signal 2 is HIGH at time 36), before quickly switching back to LOW on the next falling edge of the XO clock signal 2. As a consequence, the output clock signal 6 would exhibit a sharp increase in frequency, as the cycle period would be significantly decreased around the moment of switching and a shortened cycle period is accompanied by a proportional increase in frequency.

If the circuit 1 were to switch to the XO clock signal 2 a small period after receiving the CLK_SEL signal 8, at time 38, both input clock signals 2 and 4 would be LOW, thereby preventing this rapid oscillation of the output clock signal 6 around the moment of switching. It is therefore desirable that the two input clock signals 2 and 4 are in the same state (HIGH or LOW) at the moment of switching in order to avoid a sharp increase in frequency as a result of rapid oscillation of the output signal 6 around the moment of switching. However, if the circuit 1 were to switch to the XO clock signal 2 at time 38, the output clock signal 6 would exhibit a sharp decrease in frequency, as the time between a falling edge and a subsequent rising edge (indicated by time period 40) of the output clock signal 6 would be increased significantly. This can be avoided by switching when the rising and falling edges of the DCO signal 4 and corresponding edges of the XO signal 2 are aligned, within a small tolerance, before the moment of switching.

The switching circuit 1 is instead configured to wait to switch the output signal 6 from the DCO signal 4 to the XO signal 2 until the like edges (i.e. the rising edges, or the falling edges) of both clock sources are closely aligned (within a small margin), in order to minimise frequency fluctuations around the time of switching. In other words, the switching circuit 1 is configured to wait until the XO signal 2 and DCO signal 4 are in-phase, within a small tolerance, before switching.

In addition to this, the switching circuit 1 is also configured to switch the output clock signal 6 from the skewed-down DCO clock signal 4 to the XO clock signal 2 at a time when the XO clock signal 2 (i.e. the clock signal being switched to) is leading in phase (i.e. when the next rising edge of the XO clock signal 2 will occur before the next rising edge of the DCO clock signal 4 and/or when the next falling edge of the XO clock signal 2 will occur before the next falling edge of the DCO clock signal 4). This ensures that any frequency error that does still occur (due to the margin of tolerance allowed by the phase-alignment detection) will be in the direction of increasing the output frequency—i.e. shortening a cycle period—rather than decreasing it. This is desirable for ensuring the average output frequency remains close to the higher, nominal frequency defined by the XO signal 2, rather than being further reduced beyond the reduction already caused by the skewed-down DCO signal 4.

In this example, the circuit 1 switches from the DCO clock signal 4 to the XO clock signal 2 at time 42, just after the XO clock signal 2 changes from trailing in phase relative to the DCO clock signal 4 to leading in phase relative to the DCO clock signal 4. As a result, the output clock signal 6 exhibits a small increase in frequency due to a shortened clock cycle. If instead the circuit 1 were to switch to the XO clock signal at time 44, where the XO clock signal 2 is trailing in phase relative to the DCO clock signal 4, the output clock signal 6 would exhibit a small decrease in frequency due to a lengthened clock cycle. The reason why a small increase in frequency is preferable to a small decrease in frequency in this example is illustrated in more detail with reference to FIG. 3.

Figure 3:
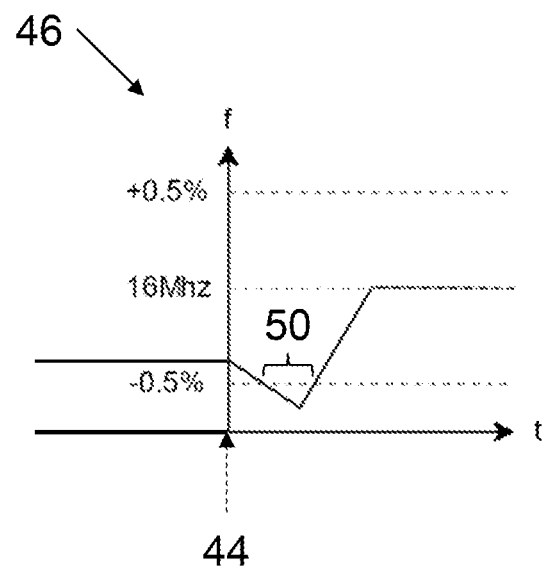
FIG. 3 contains two graphs of the output frequency of the clock signal switching circuitry over time when switching between clock signals.
Figure 3:
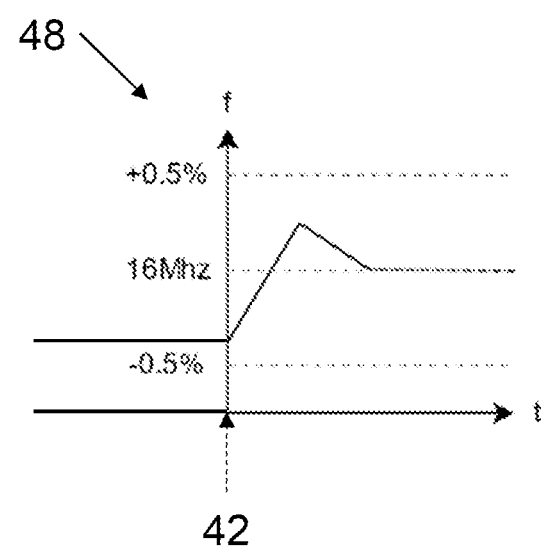

FIG. 3 shows two graph 46 and 48 simulating frequency against time of the output clock signal 6 if the circuit 1 were to switch from the DCO clock signal 4 to the XO clock signal 2 at two different respective times. The upper graph 46 hypothetically illustrates how the frequency of the output signal 6 would change just after the moment of switching, if the circuit 1 were to switch at time 44 of FIG. 2 where the clock signal being switched to (the XO signal 2) is trailing in phase relative to the clock signal being switched away from (the DCO signal 4). The lower graph 48 illustrates how the frequency of the output signal 6 changes just after the moment of switching when the circuit 1 switches at time 42 of FIG. 2 where the signal being switched to (the XO signal 2) is leading in phase. The lower graph 48 reflects the actual behaviour of the circuit 1.

As can be seen from the graphs 46 and 48, the nominal frequency of the output clock signal 6 is 16 MHz, with a margin of acceptable error of ±0.5%. As the circuit 1 is outputting the skewed down DCO clock signal 4 before switching, at the moment of switching the frequency of the output signal 6 is slightly lower than the nominal frequency of 16 MHz, but within the acceptable ±0.5% margin of error.

As can be seen from graph 46, if the circuit 1 were to switch to the XO signal 2 at time 44 where the XO signal 2 is trailing in phase, the output signal 6 would exhibit a small further decrease in frequency, before settling to the nominal frequency of 16 MHz (which is the frequency of the XO clock signal 2). As a result, the output signal 6 falls below the −0.5% acceptable error boundary for a short period of time 50. This is undesirable, as any components relying on the output clock signal 6 for timing purposes may not function correctly while the frequency of the output clock signal 6 falls outside of the acceptable error margin.

On the other hand, as can be seen from graph 48, when the circuit 1 switches to the XO signal 2 at time 42 where the XO signal is leading in phase, the output signal 6 exhibits a small increase in frequency, before settling to the nominal frequency of 16 MHz. As a result, the frequency of the output signal 6 never falls outside of the acceptable error margin. Therefore any components relying on the output clock signal 6 for timing purposes will continue to function correctly, as the output clock signal 6 does not deviate too far from the nominal frequency of 16 MHz.

The same principles apply when the circuit 1 switches from the XO signal 2 to the DCO signal 4. In order to keep the frequency of the output signal 6 within an acceptable margin of error, the DCO signal 4 (the signal being switched to) should be leading in phase, assuming the DCO is skewed down, in order to make sure that, in the moments after switching, the frequency of the output signal 6 increases slightly before decreasing to the frequency of the skewed-down DCO signal 4. If the DCO signal 4 were trailing in phase, the frequency of the output signal 6 would decrease instead, resulting in a further lowering of the average (mean) frequency of the output signal 6, and potentially even causing the output signal 6 to fall below the acceptable margin of error for a cycle.

The principle of switching from the DCO signal 4 to the XO signal 2 (or vice versa) only when the signal being switched to is leading in phase, in order to maintain an output signal 6 frequency within an acceptable margin of error, can be similarly applied if the DCO signal 4 is skewed up rather than skewed down as in FIGS. 2 and 3. However, the signal being switched to should then instead be trailing in phase relative to the signal being switched from at the moment of switching, for the same reasons of keeping the frequency of the output signal 6 within an acceptable margin: if the DCO signal 4 is skewed up, the frequency of the output signal 6 needs to avoid further increases in order to remain within an acceptable margin of error. Thus, in some alternative embodiments, the DCO signal is skewed up in frequency compared with the XO signal, and the switching circuit is configured to wait until the new clock signal that is being switched to is closely phase-aligned but is trailing the current clock signal in phase, before performing the switch. In this way, any remaining frequency error will result in a decrease in the output frequency, so help mitigate the effect of the skewed-up DCO frequency.

Figure 4:
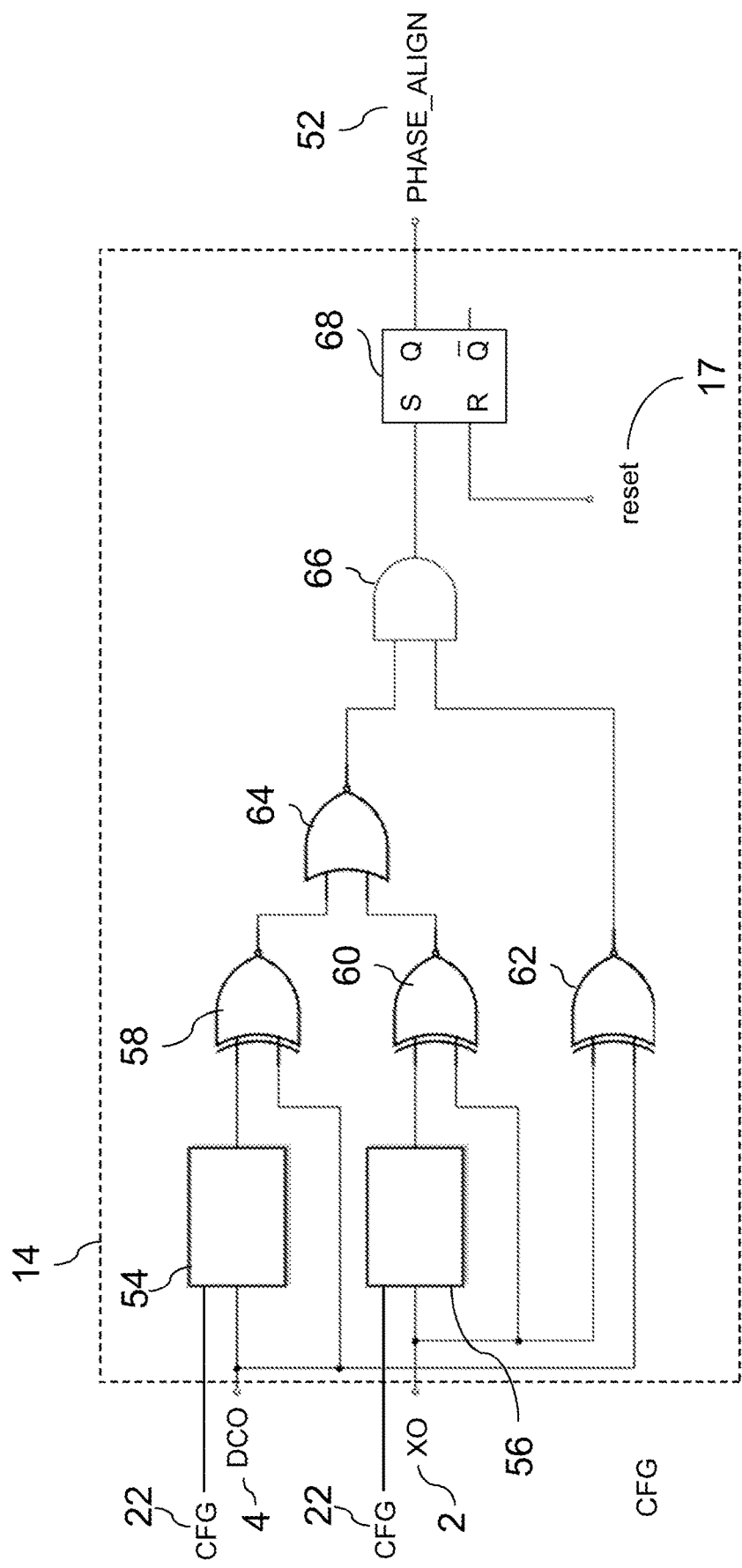
FIG. 4 is a schematic diagram of a phase-alignment detector according to an embodiment of the invention.

FIG. 4 shows a schematic diagram illustrating the phase-alignment detector 14 in more detail. The phase-alignment detector 14 takes the XO clock signal 2 and the DCO clock signal 4 as inputs, and outputs a PHASE_ALIGN signal 52 indicating that the rising and falling edges of the DCO signal 4 are aligned with the corresponding edges of XO signal 2, within a small tolerance. The phase-alignment detector 14 also takes the reset signal 17, output by the AFSM 18, as an input.

The phase-alignment detector 14 comprises two delay elements 54 and 56, three XNOR gates 58, 60 and 62, a NOR gate 64, an AND gate 66 and an asynchronous set-reset (SR) latch 68. The DCO signal 4 is coupled to the input of the delay element 54, one of the inputs of the first XNOR gate 58, and one of the inputs of the third XNOR gate 62. The output of the delay element 54 is coupled to the other input of the first XNOR gate 58. The XO signal 2 is coupled to the input of the delay element 56, one of the inputs of the second XNOR gate 60, and the other input of the third XNOR gate 62. The output of the delay element 56 is coupled to the other input of the second XNOR gate 60.

The delay elements 54 and 56 may comprise any suitable analogue or digital components that introduce a propagation delay to a signal passing therethrough (e.g. resistors, pairs of inverters in series, etc.) without changing any characteristics (e.g. frequency) of the signal. The same delay is introduced by both delay elements 54, 56. The delay is only a fraction of one clock cycle. The delay duration is configurable, in dependence on an external configuration signal CFG 22. In this way, the delay may be adjusted depending on the amount of skew offset between the two incoming clock signals. The delay should not be too large or else it will lead to inaccurate alignment, nor too small or else it can lead the detector 14 to fail to detect any phase alignment at all. In some embodiments, the delay elements 54, 56 may have an additional trim input (not shown) that can be used to compensate for process variations in the delay cells, and an additional output (not shown) that can allow the delay to be monitored from outside the circuit 1 for calibration purposes (with the delay lines temporarily configured in a loop).

The outputs of the first and second XNOR gates 58 and 60 are coupled to the respective inputs of the NOR gate 64. The outputs of the NOR gate 64 and the third XNOR gate 62 are coupled to the respective inputs of the AND gate 66. The output of the AND gate 66 is coupled to the 'set' input of the latch 68, and the 'reset' input of the latch 68 is coupled to the reset signal 17 output by the AFSM 18.

The operation of the phase-alignment detector 14 will now be described. The first XNOR gate 58 takes the DCO signal 4 as one input, and takes a delayed version of the DCO signal 4 as the other input (after propagating through the delay element 54). The first XNOR gate 58 outputs a logical '0' only if the two signals at its input are in different states. In order for the delayed DCO signal 4 and the non-delayed DCO signal 4 to be in different states at the inputs of the first XNOR gate 58, the non-delayed DCO signal 4 must have changed state (i.e. a rising or falling edge occurred) within the time delay introduced to the DCO signal 4 by the delay element 54. The first XNOR gate 58 therefore outputs a pulse (a change from a logical '1' to a logical '0' for a short period of time), the duration of which is determined by the time delay introduced by the delay element 54, at each rising edge and each falling edge of the DCO signal 4.

The delay element 56 and second XNOR gate 60 function in exactly the same way as the delay element 54 and first XNOR gate 58 such that the second XNOR gate 60 outputs a pulse, the duration of which is determined by the time delay introduced by the delay element 56, at each edge (rising or falling) of the XO signal 2. In this example, the time delays introduced by the delay elements 54 and 56 are chosen to be as close to equal as manufacturing capabilities allow.

The NOR gate 64 takes the outputs of the first and second XNOR gates 58 and 60 as its inputs. The NOR gate 64 outputs a logical '1' only if the two signals at its input are logical '0's simultaneously. In other words, the NOR gate 64 only outputs a logical '1' when the edge indicating pulses output by the XNOR gates 58 and 60 align. The NOR gate 64 therefore outputs a pulse (a change from a logical '0' to a logical '1' for a short period of time) each time an edge (rising or falling) of the XO signal 2 and the DCO signal 4 occurs at substantially the same time, with a tolerance determined by the time delay introduced by the delay elements 54 and 56.

The NOR gate 64 therefore outputs a pulse each time an edge of the XO signal 2 and an edge of the DCO signal 4 align, irrespective of whether the edges are rising or falling. This means therefore that the NOR gate 64 outputs a pulse when edges of the XO signal 2 and DCO signal 4 align and are close to being in-phase as well as when the two signals 2 and 4 are close to being 180° out of phase. The inclusion of the third XNOR gate 62 and the AND gate 66 prevent these 180° out of phase pulses from propagating to the latch 68.

The third XNOR gate 62 takes the XO signal 2 as one input, and the DCO signal 4 as the other input. The third XNOR gate 62 therefore only outputs a logical '1' if the XO signal 2 and the DCO signal 4 are in the same state at a given moment in time. If the XO signal 2 and DCO signal 4 are close to being in-phase, the third XNOR gate 62 therefore outputs a logical '1' most of the time (as the two signals 2 and 4 will be in the same state the majority of the time). If the XO signal 2 and the DCO signal 4 are close to being 180° degrees out of phase on the other hand, the third XNOR gate 62 outputs a logical '0' most of the time (as the two signals 2 and 4 will be in different states the majority of the time).

The AND gate 66 takes the outputs of the NOR gate 64 and the third XNOR gate 62 as its inputs. The AND gate 66 only outputs a logical '1' if the signals at its inputs are logical '1's at the same time. This means therefore that the AND gate 66 outputs a logical '1' pulse each time an edge of the XO signal 2 and an edge of the DCO signal 4 align but only when the two signals 2 and 4 are close to being in-phase, and does not output a pulse whenever the two signals 2 and 4 are close to being 180° out of phase.

The output of the AND gate 66 is coupled to the 'set' input of the latch 68. Therefore, when a logical '1' pulse is output by the AND gate 66, the output of the latch (the PHASE_ALIGN signal 52) is set to a logical '1', and it remains as such until it is reset by the reset signal 17 from the AFSM 18. The output of the latch 68 (the PHASE_ALIGN signal 52) therefore signals when the edges of the XO signal 2 and the DCO signal 4 have reached in-phase alignment, within a tolerance, since the phase-alignment detector 14 was last reset. The PHASE_ALIGN signal 52 is received by one of the inputs of the AND gate 16 shown in FIG. 1.

The output of the latch 68 is reset to a logical '0' by the reset signal 17, output by the AFSM 18 shown in FIG. 1. The AFSM 18 is therefore responsible for determining the timing at which the latch 68 is reset.

Figure 5:
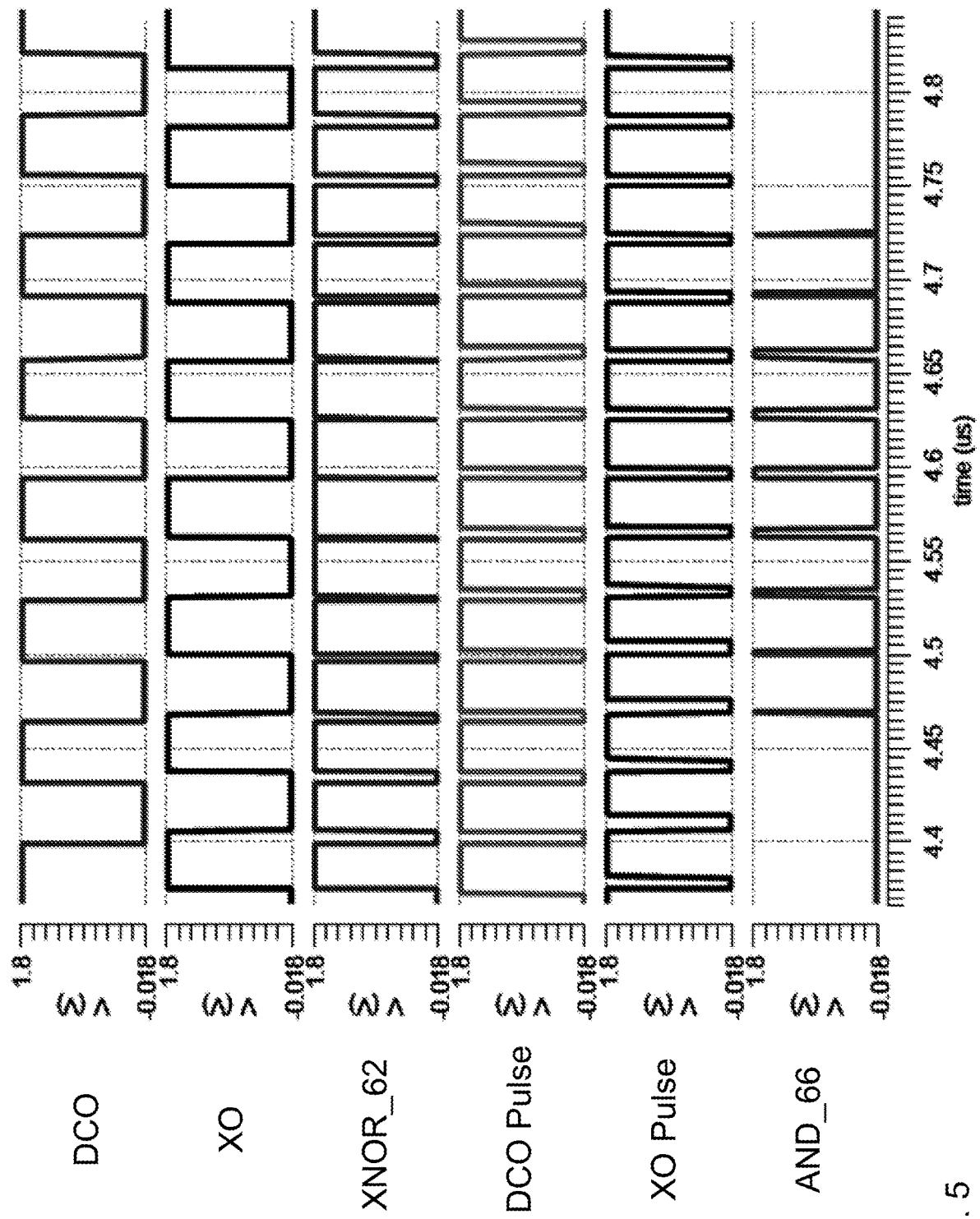
FIG. 5 is a set of time-aligned plots of simulated signals at various points in the phase-alignment detector over an exemplary time window.

FIG. 5 shows a time-alignment simulation of voltages, over a few clock cycles, as the XO signal 2 and DCO signal 4 approach, reach and then pass phase-alignment. The top plot shows the DCO signal 4; the second plot shows the XO signal 2; the third plot shows the output of the third XNOR gate 62 that filters the 180° out-of-phase case (not relevant over the period shown in FIG. 5); the fourth plot shows the output of the first XNOR gate 58; the fifth plot shows the output of the second XNOR gate 60; and the bottom plot shows the output of the AND gate 66.

Figure 6:
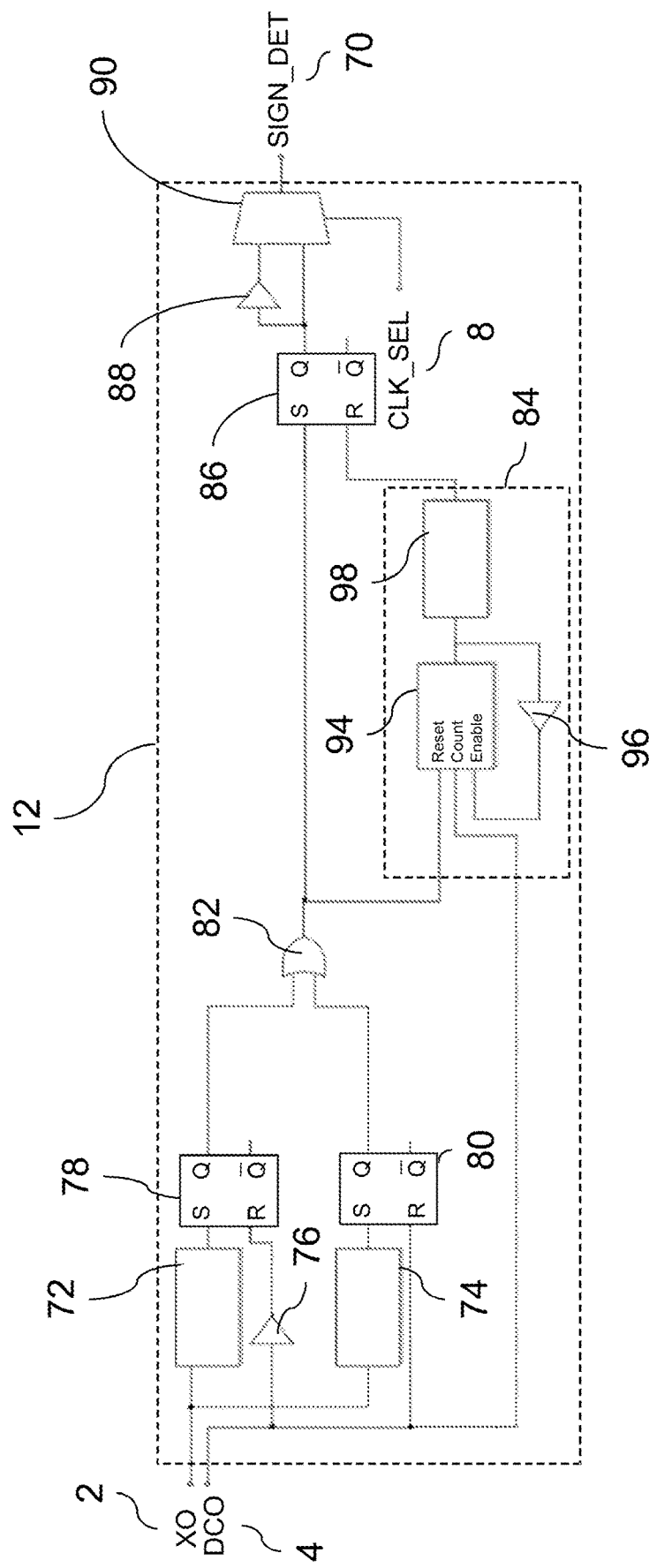
FIG. 6 is a schematic diagram of a sign detector according to an embodiment of the invention.

FIG. 6 shows a schematic diagram illustrating the sign detector 12 in more detail. The sign detector 12 takes the XO clock signal 2 and the DCO clock signal 4 as inputs, and outputs a SIGN_DET signal 70 indicating which of the two input clock signals 2 and 4 is leading in phase. The sign detector 12 also takes the CLK_SEL signal 8 as an input.

The sign detector 12 comprises a falling edge pulse generator 72, a rising edge pulse generator 74, an inverter 76, two asynchronous SR latches 78 and 80, an OR gate 82, counter circuitry 84, a third asynchronous SR latch 86, another inverter 88 and a multiplexer 90. The counter circuitry 84 comprises a four-bit ripple counter 94, an inverter 96 and a second rising edge pulse generator 98.

The XO clock signal 2 is coupled to the inputs of the falling edge pulse generator 72 and the rising edge pulse generator 74. The output of the falling edge pulse generator 72 is coupled to the 'set' input of the latch 78, and the output of the rising edge pulse generator 74 is coupled to the 'set' input of the latch 80. The DCO clock signal 4 is coupled to the input of the inverter 76, the 'reset' input of the latch 80, and the 'count' input of the four-bit ripple counter 94 of the count circuitry 84. The output of the inverter 76 is coupled to the 'reset' input of the latch 78. The rising edge pulse generator 72 may comprise any suitable components for generating a pulse at its output each time a rising edge is detected at its input, and the falling edge pulse generator 74 may comprise any suitable components for generating a pulse at its output each time a falling edge is detected at its input.

The outputs of the latches 78 and 80 are coupled to the inputs of the OR gate 82. The output of the OR gate 82 is coupled to the 'set' input of the third latch 86, as well as to a 'reset' input of the ripple counter 94 of the count circuitry 84. The output of the count circuitry 84 is coupled to the 'reset' input of the third latch 86. The output of the third latch 86 is coupled to one of the inputs of the multiplexer 90, and to the input of the inverter 88. The output of the inverter 88 is coupled to the other input of the multiplexer 90. The 'select' input of the multiplexer 90 receives the CLK_SEL signal 8.

Within the count circuitry 84, the output of the ripple counter 94 is coupled to the input of the second rising edge pulse generator 98, and to the input of the inverter 96. The output of the inverter 96 is coupled to the 'enable' input of the ripple counter 94. The output of the second rising edge pulse generator 98, and therefore the output of the count circuitry 84, is coupled to the 'reset' input of the third latch 86.

The operation of the sign detector 12 will now be described. The falling edge pulse generator 72 generates a logical '1' pulse each time a falling edge is detected in the XO signal 2 at its input, and feeds this to the 'set' input of the first latch 78. The inverter 76 inverts the DCO signal 4, and feeds the inverted DCO signal 4 to the 'reset' input of the latch 78. The output of the latch 78 is therefore set to a logical '1' when the falling edge pulse generator 72 generates a pulse, provided that the signal at the 'reset' input of the latch 78 is a logical '0'. As the 'reset' input of the latch 78 is coupled to the inverted DCO signal 4, this is only the case when the DCO signal 4 is a logical '1'. Therefore, the output of the latch 78 is set to a logical '1' only if a falling edge occurs in the XO signal 2 (indicated by a pulse from the falling edge pulse generator 72) when the DCO signal 4 is a logical '1'. The output of the latch 78 is reset to a logical '0' when a rising edge occurs at the output of the inverter 76, which occurs whenever a falling edge occurs in the DCO signal 4. Thus the first latch 78 outputs a logical '1' between each falling edge of the XO signal 2 and each falling edge of the DCO signal 4, whenever the falling edge of the XO signal 2 precedes (i.e. leads) the falling edge of the DCO signal 4 by up to half a DCO cycle period, and outputs a logical '0' otherwise.

The rising edge pulse generator 74 generates a logical '1' pulse each time a rising edge is detected in the XO signal 2 at its input, and feeds this to the 'set' input of the second latch 80. The output of the latch 80 is therefore set to a logical '1' when the rising edge pulse generator 74 generates a pulse, provided that the signal at the 'reset' input of the latch 80 is a logical '0'. As the 'reset' input of the latch 80 is coupled to the DCO signal 4, this is only the case when the DCO signal is a logical '0'. Therefore, the output of the latch 80 is set to a logical '1' only if a rising edge occurs in the XO signal 2 (indicated by a pulse from the rising edge pulse generator 74), and the DCO signal 4 is a logical '0'. The output of the latch 80 is reset to a logical '0' when a rising edge occurs in the DCO signal 4. Thus the second latch 80 outputs a logical '1' between each rising edge of the XO signal 2 and each rising edge of the DCO signal 4, whenever the rising edge of the XO signal 2 precedes (i.e. leads) the rising edge of the DCO signal 4 by up to half a DCO cycle period, and outputs a logical '0' otherwise.

Figure 7:
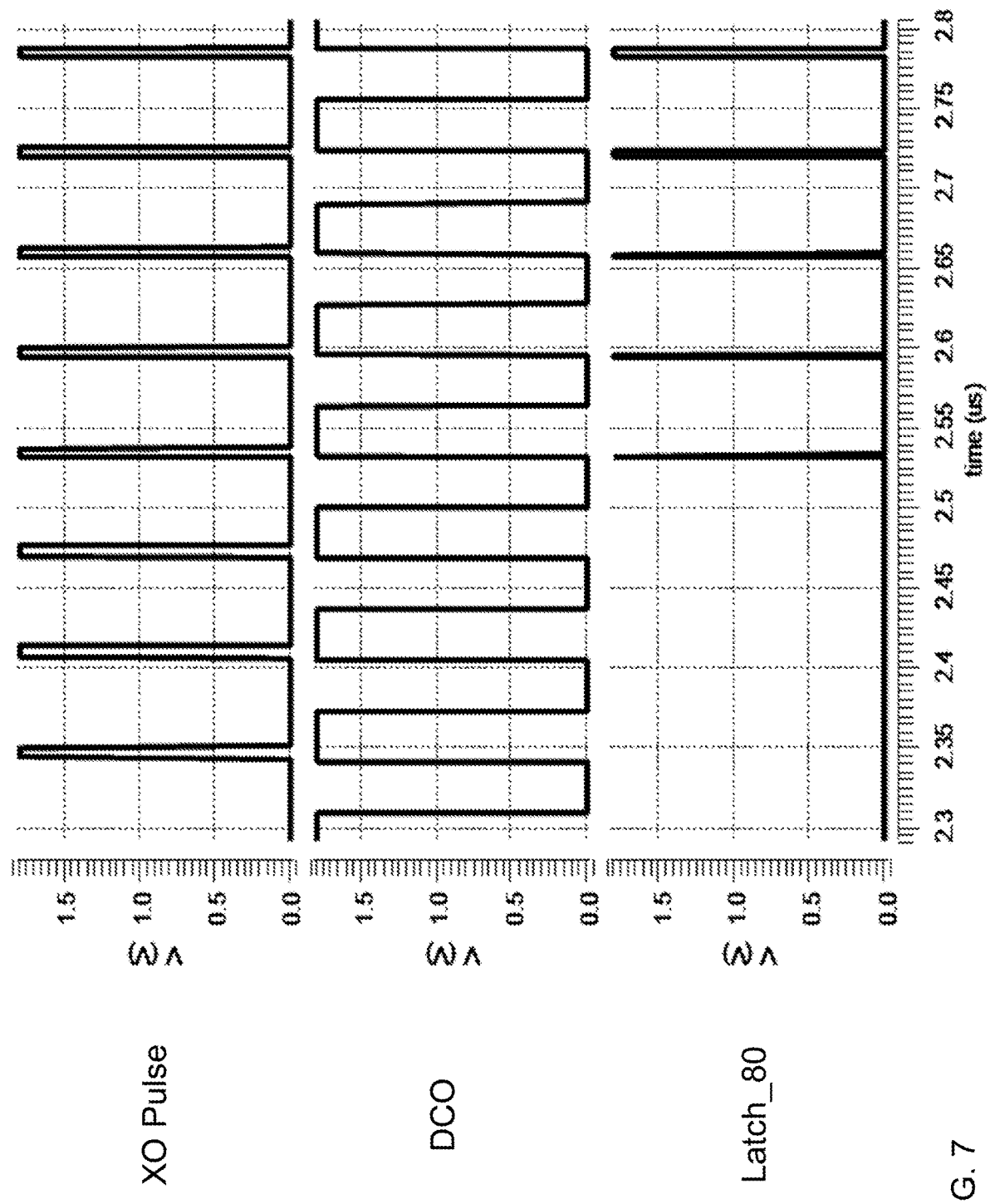
FIG. 7 is a set of time-aligned plots of simulated signals at various points in the signed detector over an exemplary time window.

FIG. 7 exemplifies this behaviour of the second latch 80 as the XO signal 2 transitions from lagging to leading the DCO signal 4. The top plot shows the output of the rising-edge pulse generator 74; the middle plot shows the DCO signal 4; and the bottom plot shows the output of the second latch 80. It can be seen that the output of the latch 80 is low until the moment the rising edge of the XO signal 2 starts to arrive ahead of the rising edge of the DCO signal 4, at which point the output of the latch starts to pulse high with each XO rising edge. The pulses will widen progressively until the signals reach 180° out of phase.

There is a deadband region in the sign detector 12 on the first edges after the sign has flipped, as the pulses out of the latches 78, 80 will be very short and likely not to propagate. In the layout, some extra path delay may be added deliberately to the DCO path to compensate for this deadband, to make the sign flip very close to the point where the XO clock signal 2 actually starts leading.

The outputs of the latches 78 and 80 are coupled to respective inputs of the OR gate 82. The OR gate 82 therefore outputs a logical '1' each time a rising edge of the XO signal 2 is detected to be leading in phase relative to a rising edge of the DCO signal 4, or a falling edge of the XO signal 2 is detected to be leading in phase relative to a falling edge of the DCO signal 4. The output of the OR gate 82 is coupled to the 'set' input of the third latch 86. The output of the third latch 86 is therefore set to a logical '1' when the XO signal 2 is detected to be leading in phase relative to the DCO signal 4, irrespective of whether this has been detected from a rising or falling edge of the XO signal 2.

The output of the OR gate 82 is also coupled to the 'reset' input of the ripple counter 94 in the counter circuitry 84. The ripple counter 94 is not limited to four bits, but may be a ripple counter comprising any suitable number of bits. The counter 94 is used to the reset the third latch 86 after the sign has flipped. This is done by continuously resetting the counter while there are pulses coming from the latches 78, 80, indicating that the XO signal 2 is leading in phase, but when the XO signal 2 is no longer leading in phase, there will be no reset pulses so the counter will start counting until it overflows (i.e. after sixteen DCO cycles in this example). This triggers a reset of the third latch 86. This will happen shortly after the phase relationship has passed 180°.

In more detail, the ripple counter 94 receives the DCO signal 4 at its 'count' input and increases its count on each rising edge of the DCO signal 4. The ripple counter 94 is reset to zero (i.e. restarted) on each rising edge of the output of the OR gate 82. When the XO signal 2 is leading in phase relative to the DCO signal 4, the OR gate 82 continually outputs pulses of logical '1' to the 'reset' input of the ripple counter 94, thereby causing the ripple counter 94 to continually reset back to '0' when the XO signal 2 is leading phase relative to the DCO signal 4.

When the ripple counter 94 overflows (i.e. reaches it maximum count, or it reaches a count where the most significant bit is a logical '1') it outputs a logical '1' to the second inverter 96 and the second rising edge pulse generator 98. This occurs only when the XO signal 2 is trailing in phase relative to the DCO signal 4, as the OR gate 82 does not continually output pulses of logical '1'. The inverter 96 then outputs a logical '0' to the 'enable' input of the ripple counter 94, thereby causing the ripple counter 94 to hold the current count until further pulses coming from the OR gate 82 are received at the 'reset' input, thereby causing the counter to reset back to zero. The second rising edge pulse generator 98 also detects the rising edge from the counter 94 at its input, and outputs a logical '1' pulse to the 'reset' input of the third latch 86. This resets the output of the latch 86 to a logical '0'.

The ripple counter 94 therefore resets the output of the latch 86 a short period of time after the XO signal 2 stops leading in phase relative to the DCO signal 4 (i.e. just after the XO signal 2 and DCO signal 4 pass being 180° out of phase). It is not important that the counter circuitry 84 resets the latch 86 a short period of time after the XO signal 2 and DCO signal 4 pass being 180° out of phase, provided the latch 86 is reset before the XO signal 2 and DCO signal 4 become close to being in-phase again, as the phase-alignment detector 14 prevents the switching circuitry 1 from switching from one clock signal to another until the XO signal 2 and DCO signal 4 are close to being in-phase.

The output of the latch 86 therefore indicates whether the XO signal 2 is leading in phase relative to the DCO signal 4, with an output of a logical '1' indicating that the XO signal 2 is leading in phase and an output of a logical '0' indicating that the XO signal 2 is trailing in phase. The output of the latch 86 is fed to one of the inputs of the multiplexer 90, and the input of the inverter 88. The output of the inverter 88 is then fed to the other input of the multiplexer 90. Therefore, one input of the multiplexer 90 is the output of the latch 86, and the other is the inverted output of the latch 86. The non-inverted input of the multiplexer 86 therefore indicates (with a logical '1') that the XO signal 2 is leading in phase relative to the DCO signal 4, and the inverted input of the multiplexer 86 indicates (with a logical '1') that the DCO signal 4 is leading in phase relative to the XO signal 2. The CLK_SEL signal 8 determines which of these two inputs are output by the multiplexer 90, thereby allowing the sign detector 14 to output a signal indicating that the XO signal 2 is leading in phase (if the XO signal 2 is the signal to be switched to by the switching circuitry 1), or to output a signal indicating that the DCO signal 4 is leading in phase (if the DCO signal 4 is the signal to be switched to by the switching circuitry 1).

Turning back to FIG. 1, it can be seen that the outputs of the sign detector 12 and the phase-alignment detector 14 are coupled to the inputs of the AND gate 16. The AND gate 16 therefore only outputs a logical '1' when the outputs of both the sign detector 12 and the phase-alignment detector 14 are logical '1's. This means, therefore, that the output of the AND gate 16 is a signal indicating that the phase-alignment detector 14 has detected that the two clock signals 2, 4 are close to being in phase, and that the sign detector 12 has detected that whichever of the clock signals 2, 4 is being switched to is leading in phase. The output of the AND gate 16 is coupled to an input of the AFSM 18, thereby allowing the AFSM 18 to detect when the necessary criteria for switching between the clock signals 2 and 4 are met by detecting a logical '1' output by the AND gate 16.

The AFSM 18 is configured to output a CLK_SWITCH signal 20 to the multiplexer 10 in response to the CLK_SEL signal 8 indicating that the switching circuitry 1 should switch from outputting the XO signal 2 to outputting the DCO signal 4, or vice versa, once the AFSM 18 has detected a logical '1' output by the AND gate 16, thereby indicating that the criteria for switching clock signals are met. The CLK_SWITCH signal 20 acts as the control input for the multiplexer 10, and thereby determines which of the inputs to the multiplexer 10 should be output. The CLK_SWITCH signal 20 may be provided to other parts of the SoC 3 in order to indicate which clock signal 2 or 4 is currently being output.

In general, the AFSM 18 is configured to output a CLK_SWITCH signal 20 immediately in response to a change in the output of the AND gate 16 to a logical '1' (i.e. a rising edge) if the CLK_SEL signal 8 already indicates that a switch should be performed. This ensures that the switching between clock signals 2 and 4 is performed as soon as possible once the criteria for switching are met. With appropriate design of the AFSM 18 and the multiplexer 10, it can be ensured that the switch process completes within less than half a clock cycle, so that the switch will always occur while both signals 2, 4 are in the same state.

However, the AFSM 18 is configured not to switch from one clock signal 2 or 4 to the other immediately upon reception of a change in the CLK_SEL signal 8, if the output of the AND gate 16 already indicates that the criteria for doing so are met, but rather to delay the switch until the output of the AND gate 16 next transitions to a logical '1'. This is because it is possible that the time at which the CLK_SEL signal 8 is received is right at the very end of the acceptable transition period—i.e. with the clock signals 2 and 4 in phase, within a tolerance, and with the signal being switched to leading in phase, but with the two clock signals 2 and 4 just about to move too far out of phase to switch. This means that the AFSM 18 in effect waits for the phase relationship between the clock signals 2 and 4 to change by nearly a full period, until the two signals 2 and 4 are close to being in phase again and the clock signal being switched to is leading in phase. This avoids uncertainty arising from switching clock signals at a time which may be undesirable due to the time it takes to initiate the switching procedure.

In some embodiments, the sign detector 12 may comprise a further AFSM configured to control the 'reset' signal 17 to the latch 68 of the phase detector 14. In such embodiments, the further AFSM is configured to ensure that two clock edges have arrived, and that the SIGN_DET signal 70 is currently a logical '0' (i.e. low), before releasing the 'reset' signal 17. In doing so, the PHASE_ALIGN signal 52 output by the phase detector 14 is only signalled after the sign detector 12 AFSM detects that two clock edges have arrived and that the SIGN_DET signal 70 is currently a logical '0' (i.e. low), thereby avoiding any uncertainty arising from switching at an undesirable time as described above. Consequently, the AND gate 16 is configured to only output a logical '1' when all conditions for switching are met.

The AFSM 18 may also, in some embodiments, provide an override mechanism that allows a switch to be forced even when the alignment conditions are not met.

It will be appreciated by those skilled in the art that the invention has been illustrated by describing one or more specific embodiments thereof, but is not limited to these embodiments; many variations and modifications are possible, within the scope of the accompanying claims.

The invention claimed is:

1. A clock selector circuit comprising:
   a first input for receiving a reference clock signal having a reference frequency;
   a second input for receiving an offset clock signal having an offset frequency, wherein the offset frequency differs from the reference frequency by a frequency offset;
   a clock output for outputting the reference clock signal or the offset clock signal as an output clock signal; and
   switching circuitry,
   wherein the switching circuitry comprises a switching input and is arranged, when the clock selector circuit is outputting a current one of the reference and offset clock signals as the output clock signal, in response to receiving a switching signal at the switching input indicating that the output clock signal should be switched to be a new one of the reference and offset clock signals, to detect when like edges of the reference clock signal and the offset clock signal are aligned to within a predetermined tolerance with the new clock signal leading the current clock signal in phase, if the offset frequency is lower than the reference frequency, or with the new clock signal trailing the current clock signal in phase, if the offset frequency is higher than the reference frequency, and, in response to said detection, to switch to outputting the new clock signal from the clock output.

2. The clock selector circuit of claim 1, wherein the clock selector circuit is arranged to switch to outputting the new clock signal from the clock output within less than half a clock period of the reference clock signal after the switching circuitry detects that like edges of the reference clock signal and the offset clock signal are aligned to within a predetermined tolerance with the new clock signal leading the current clock signal in phase, if the offset frequency is lower than the reference frequency, or with the new clock signal trailing the current clock signal in phase, if the offset frequency is higher than the reference frequency.

3. The clock selector circuit of claim 1, wherein the clock selector circuit is arranged to receive an offset clock signal that is lower than the reference frequency, and wherein the switching circuitry is configured to detect when the new clock signal is leading the current clock signal in phase.

4. The clock selector circuit of claim 1, wherein the switching circuitry is arranged to determine phase alignment based both on rising edges and on falling edges of the reference and offset clock signals.

5. The clock selector circuit of claim 1, wherein the switching circuitry comprises phase-alignment detector circuitry arranged to output a phase-alignment signal when like edges of the reference clock signal and the offset clock signal are aligned to within the predetermined tolerance.

6. The clock selector circuit of claim 5, wherein the phase-alignment detector circuitry comprises a reset input and is configured to signal in response to detecting that like edges of the reference clock signal and the offset clock signal are aligned, to within the predetermined tolerance, after receiving a reset signal at the reset input.

7. The clock selector circuit of claim 1, wherein the switching circuitry comprises sign detector circuitry arranged to output a sign signal indicating whether or when the reference clock signal is leading the offset clock signal in phase.

8. The clock selector circuit of claim 7, wherein the switching circuitry comprises phase-alignment detector circuitry arranged to output a phase-alignment signal when like edges of the reference clock signal and the offset clock signal are aligned to within the predetermined tolerance, and wherein the switching circuitry is configured to use the phase-alignment signal and the sign signal to determine when to start outputting the new clock signal from the clock output.

9. The clock selector circuit of claim 8, wherein the switching circuitry is arranged to combine the phase-alignment signal and the sign signal in a logic AND gate.

10. The clock selector circuit of claim 1, comprising phase-alignment detector circuitry arranged to:
generate a reference-clock pulse each time a rising edge occurs in the reference clock signal and each time a falling edge occurs in the reference clock signal;
generate an offset-clock pulse each time a rising edge occurs in the offset clock signal and each time a falling edge occurs in the offset clock signal; and
use the reference-clock pulse and the offset-clock pulse to generate an alignment pulse each time an edge of the reference clock signal occurs within a predetermined time interval of a like edge of the offset clock signal.

11. The clock selector circuit of claim 10, wherein the phase-alignment detector circuitry comprises:
a first logic gate for generating said reference-clock pulse, wherein a first input of the first logic gate is arranged to receive the reference clock signal and a second input of the first logic gate arranged to receive a time-delayed version of the reference clock signal;
a second logic gate for generating said offset-clock pulse, wherein a first input of the second logic gate is arranged to receive the offset clock signal and a second input of the second logic gate arranged to receive a time-delayed version of the offset clock signal; and
a further logic gate for generating said alignment pulse, wherein a first input of the further logic gate is arranged to receive an output of the first logic gate and a second input of the further logic gate arranged to receive an output of the second logic gate.

12. The clock selector circuit of claim 1, comprising sign detector circuitry comprising a first edge alignment detector configured to output a pulse each time a falling edge of the reference clock signal is detected while the offset clock signal is high, and a second edge alignment detector configured to output a pulse each time a rising edge of the reference clock signal is detected while the offset clock signal is low.

13. An electronic apparatus comprising the clock selector circuit of claim 1, wherein the electronic device further comprises circuitry arranged to be clocked by the output clock signal output by the clock selector circuit.

14. A method of switching clock signals, the method comprising:
receiving a reference clock signal having a reference frequency;
receiving an offset clock signal having an offset frequency, wherein the offset frequency differs from the reference frequency by a frequency offset;
outputting a current one of the reference clock signal and the offset clock signal as an output clock signal;
receiving a switching signal indicating that the output clock signal should be switched to be a new one of the reference clock signal and the offset clock signal;
in response to receiving the switching signal, detecting when like edges of the reference clock signal and the offset clock signal are aligned to within a predetermined tolerance with the new clock signal leading the current clock signal in phase, if the offset frequency is lower than the reference frequency, or with the new clock signal trailing the current clock signal in phase, if the offset frequency is higher than the reference frequency; and
in response to said detecting, starting to output the new clock signal as the output clock signal.

15. The method of claim 14, wherein the frequency offset is less than 10% of the reference frequency.

* * * * *